United States Patent
Masenas et al.

(10) Patent No.: US 6,563,388 B2
(45) Date of Patent: May 13, 2003

(54) TIMING LOOP BANDWIDTH TRACKING DATA RATE

(75) Inventors: Charles J. Masenas, Essex Junction, VT (US); Troy A. Seman, Essex Junction., VT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 09/833,192

(22) Filed: Apr. 11, 2001

(65) Prior Publication Data

US 2002/0175768 A1 Nov. 28, 2002

(51) Int. Cl.[7] .............................................. H03L 7/00
(52) U.S. Cl. ................................ 331/17; 331/177 R
(58) Field of Search .................. 331/17, 177 R, 331/179; 360/51

(56) References Cited

U.S. PATENT DOCUMENTS

| | | | | |
|---|---|---|---|---|
| 4,675,613 A | * | 6/1987 | Naegeli et al. | 327/156 |
| 5,382,922 A | * | 1/1995 | Gersbach et al. | 331/1 A |
| 6,300,838 B1 | * | 10/2001 | Kelkar | 327/156 |
| 6,433,945 B1 | * | 8/2002 | Norton, Jr. | 360/46 |

* cited by examiner

Primary Examiner—Robert Pascal
Assistant Examiner—Joseph Chang
(74) Attorney, Agent, or Firm—McGinn & Gibb, PLLC; Richard A. Henkler, Esq.

(57) ABSTRACT

A complementary metal oxide semiconductor PLL includes an input for receiving a reference frequency and a feedback loop for determining a phase error based on the reference frequency. The feedback loop includes a calibration DAC (amplifier with a digital gain control input) and a bandwidth DAC in series. The ICO controller is well known in control theory as a PI or proportional-integral controller. A proportional path supplies a proportional signal to the calibration amplifier and an integral path supplies an integral signal (a signal that is integrated in time) to the calibration amplifier.

19 Claims, 4 Drawing Sheets

PHASE TRANSFER (2:1 FREQUENCY W/O BAND CONTROL)

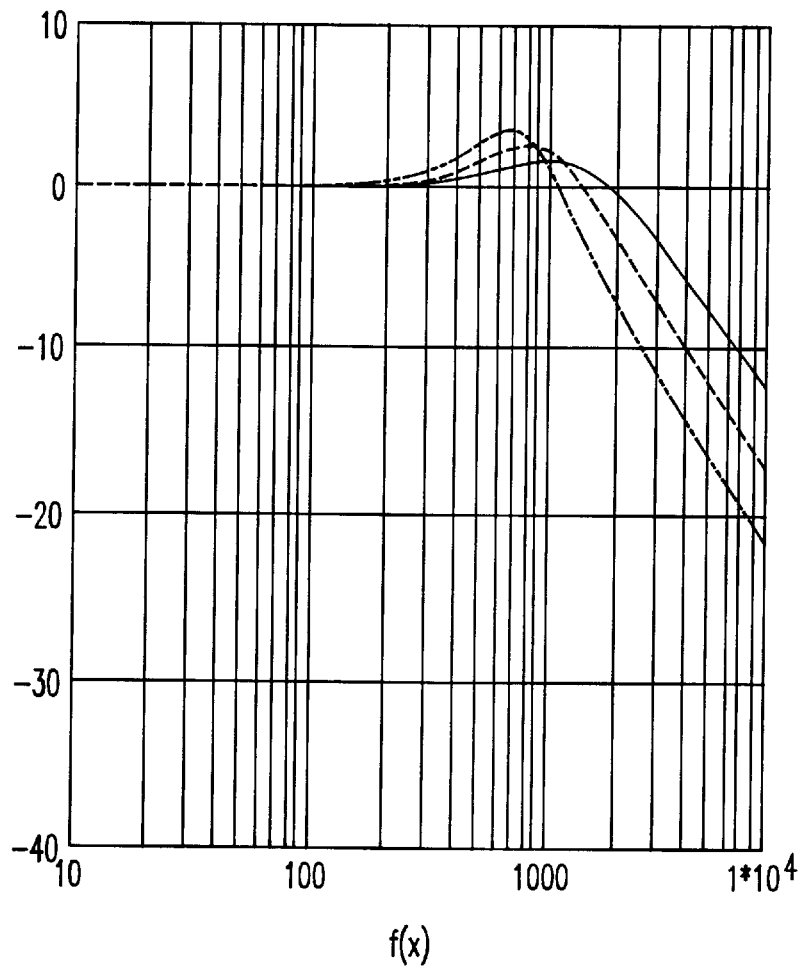

$$\underline{20 \cdot \log} \left( \left| P \left( s(f), N_{min}, 32, K_{o\,minnom}, Acal_{nom}, \frac{Aband_{min}}{Aband_{min}} \right) \right| \right)$$

$$\underline{20 \cdot \log} \left( \left| P \left( s(f), N_{mid}, 32, K_{o\,midnom}, Acal_{nom}, Aband_{mid} \right) \right| \right)$$

$$\underline{20 \cdot \log} \left( \left| P \left( s(f), N_{max}, 32, K_{o\,maxnom}, Acal_{nom}, \frac{Aband_{max}}{Aband_{max}} \right) \right| \right)$$

FIG.4

TIMING LOOP BANDWIDTH TRACKING DATA RATE

BACKGROUND OF THE INVENTION

1. Field of the Invention

The present invention generally relates to a clock recovery and frequency synthesizer timing loop and more particularly to an improved circuit for controlling loop dynamics of phase locked loops used in clock recovery and frequency synthesis.

2. Description of the Related Art

Conventional systems utilize phase locked loops (PLLs) for a wide range of purposes. For example, frequency synthesizers and clock recovery circuits are used in computer storage systems (such as optical, magnetic, and the like). A phase-locked-loop frequency synthesizer normally generates the frequency at which the data is written for hard disk drives. The same frequency is recovered from the data by a clock recovery PLL in the hard disk drive. The PLL includes a phase detector for generating a phase error estimate based on the difference between the estimated samples and the read signal samples. A PLL loop controller filters the phase error, and the filtered phase error operates to synchronize the channel samples to the baud rate. Conventionally, the phase error adjusts the frequency of a sampling clock which is typically the output of a variable frequency oscillator (VFO). The output of the VFO controls a sampling device, such as an analog-to-digital (A/D) converter, to synchronize the sampling to the baud rate.

Phase-locked loops in hard disk drive read channel integrated circuits (ICs) are generally required to operate over a two-to-one frequency range, while maintaining low clocking jitter characteristics. The synthesizer circuit often uses a voltage controlled oscillator (VCO) or current controlled oscillator (ICO) to produce the desired clocking frequency, such that the oscillator frequency, $f_{osc}$, is a rational multiple, N/D of the externally generated reference frequency, $f_{ref}$. The PLL loop gain of a sampled data system may change with operating frequency. In signal processing terminology, the coefficients in the z or discrete frequency domain may depend on the sampling period, T, in the description of the loop dynamics. For this reason, the loop response may change with respect to the sampling period. It is desirable to maintain constant loop corrections/gain over the desired operating frequency range to maintain constant synthesizer loop dynamics. For example, if the loop has a lock-in time of 12 bytes at a 200 MHz data rate the lock-in time should be 12 bytes at 400 Mhz. Note that in the case of the higher data rate, the lock-in time is halved but is the same when measured in bit intervals. The purpose of the compensation this invention provides is to maintain constant loop response when measured in bit intervals.

However, conventional frequency synthesizers are formed using bipolar transistors. A bipolar arrangement is illustrated in FIG. 1 and is discussed below. Fabrication of devices using complementary metal oxide semiconductor (CMOS) technology is becoming more popular because of the reduced cost, reduced size, and increased yield associated with CMOS devices. Therefore, there is a need for a viable oscillator structure which can be manufactured using CMOS technology. The invention described below addresses this need and provides a unique oscillator control in a CMOS structure.

SUMMARY OF THE INVENTION

In view of the foregoing and other problems, disadvantages, and drawbacks of the conventional oscillator controller, the present invention has been devised, and it is an object of the present invention to provide a structure and method for an improved oscillator controller that keeps the dynamic behavior of the timing loop constant on a per bit basis over all operating frequencies.

In order to attain the object(s) suggested above, there is provided, according to one aspect of the invention a complementary metal oxide semiconductor PLL that includes an input for receiving a reference frequency and a feedback loop for determining a phase error based on the reference frequency. The feedback loop includes a calibration DAC (amplifier with a digital gain control input) and a bandwidth DAC in series. The ICO controller is well known in control theory as a PI or proportional-integral controller. A proportional path supplies a proportional signal to the calibration amplifier and an integral path supplies an integral signal (a signal that is integrated in time) to the calibration amplifier.

The proportional signal and the integral signal are summed and multiplied by the same scaling factor of the calibration amplifier and the bandwidth amplifier. The proportional signal and the integral signal are scaled with changes in the reference frequency. The integral path includes multiple amplifiers, such that the proportional signal is scaled by the reference frequency and the integral signal is scaled by the reference frequency squared. The feedback loop has a dynamic behavior that is constant on a per bit basis over all operating frequencies. The calibration amplifier and the bandwidth amplifier scale the proportional signal and the integral signals as a percent of oscillator bias current.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 4 is a graph illustrating the phase transfer of the frequency synthesizer shown in FIG. 3.

DETAILED DESCRIPTION OF PREFERRED EMBODIMENTS OF THE INVENTION

The present invention achieves scaling of the proportional and integral signals as a percent of the oscillator bias current, using an all CMOS technology. As mentioned above, conventional implementations depended on pn junction diodes for proper scaling.

Figure 1:
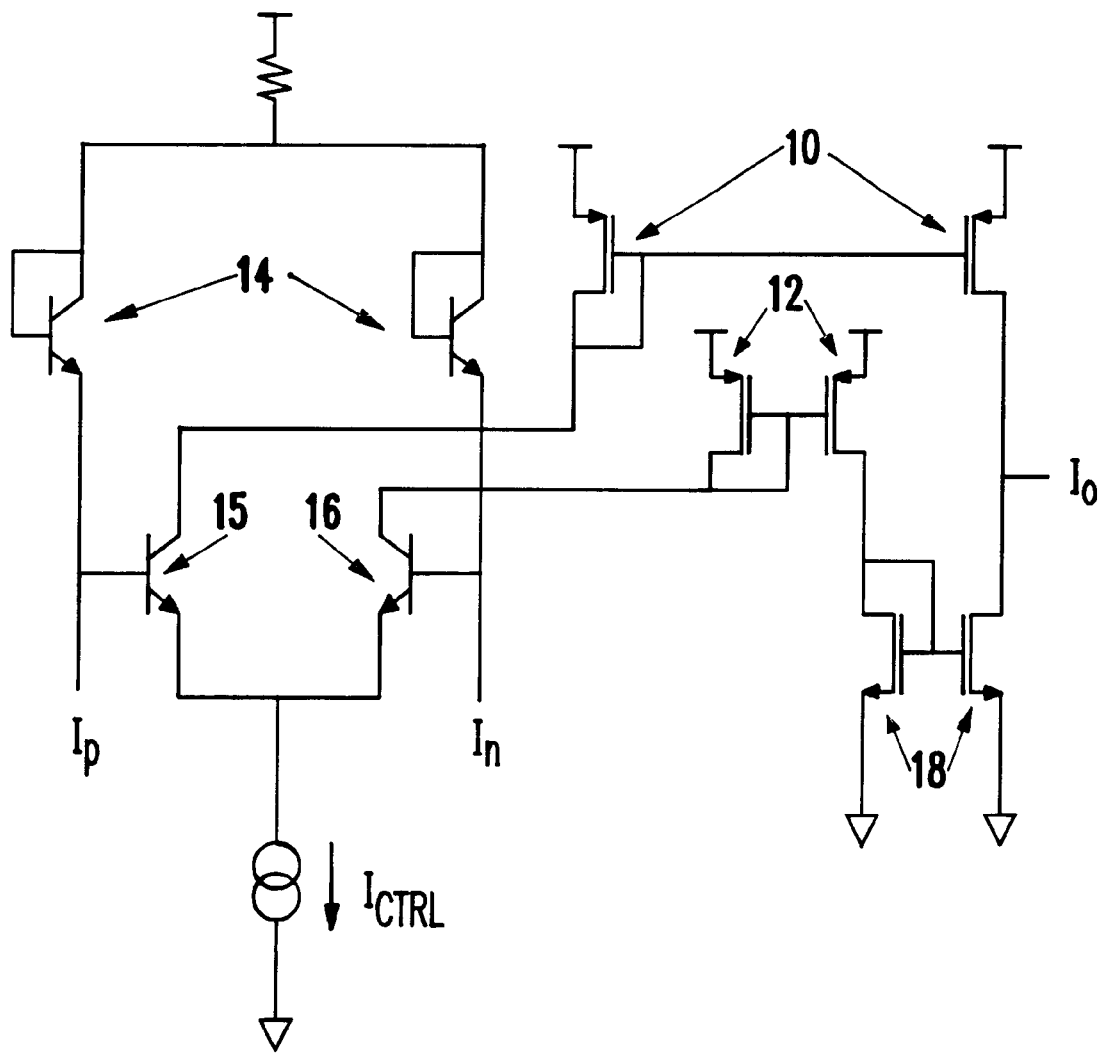
FIG. 1 is a schematic diagram of a bipolar circuit for a frequency synthesizer.

As shown in FIG. 1, proportional and integral signals were previously proportionally scaled by using a differential stage with diode loads. More specifically, FIG. 1 illustrates a frequency synthesizer control amplifier formed in bipolar technology. The structure shown in FIG. 1 is not necessarily conventionally well-known at that time of filing this application, but instead is used to contrast the structures shown in FIGS. 2 and 3.

FIG. 1 represents a scaling amplifier for control of an ICO. The input signal is differential current Ip-In. The scaling input is current $I_{CTRL}$. The output is current Io. The emitters of transistor diode loads 14 provide the differential input voltage for the bipolar transistor emitter-coupled pair of 15 and 16. Item 10 represents two transistors (e.g., field effect transistors (FET)) that are arranged in a 1:1 current mirror configuration. The current $I_{15}$ which flows through transistor 15 also flows in each of the transistors in 10.

Likewise, 1:1 FET transistor mirrors 12 and 18 are fed current $I_{16}$ through transistor 16. The output current Io is the difference of the currents through 10 and 18 which is equal to $I_{15}$–$I_{16}$.

The differential voltage across the emitters of 14 is $$\Delta V_{14} = .026 \text{ volts} \cdot \ln\left(\frac{I_p}{I_n}\right)$$

The current output of the emitter coupled differential pair 15 and 16 is $$\frac{I_{15}}{I_{16}} = e^{\frac{\Delta V_{14}}{.026 \text{ volts}}} = \frac{I_p}{I_n}$$

Using the fact that $I_{CTRL} = I15 + I16$ $$I_o = I_{CTRL} \cdot \left[\frac{I_n - I_p}{I_n + I_p}\right]$$

The quantity in brackets is the fractional change in the input current. Thus, if the input current changes by 2% the output current will change by 2% of $I_{CTRL}$. Since $I_{CTRL}$ is approximately proportional to the operating frequency, the error correction signal will always scale with the operating frequency. For each such stage shown in FIG. 1, the output signal is proportional to the magnitude of a controlling signal, $I_{CTRL}$. In this way, the proportional and integral signals are scaled as a percent of the control signal. This is the same net effect as the CMOS solution shown in FIG. 3 discussed below.

Phase locked loops (PLLs) must satisfy the separate requirements of large and small signal phase and frequency. The large signal operating frequency is satisfied with the invention by providing a direct current (DC) signal current to the current controlled oscillator (ICO). Because of variations in process, temperature, and voltage, the DC current needed to bias an ICO at a particular frequency (say, 200 MHz) can vary over as much as a 2 to 1 bias current ratio. That is, in order to operate the ICO at 200 MHz the bias current may be as little as 200 uA or as great as 400 uA for a sample of ICOs produced on a manufacturing line subject to random processes. Because a particular ICO must operate over a 2 to 1 frequency range, the total current range must therefor be 4 to 1 to operate over the range of frequencies over all operating conditions. The primary purpose of the invention using band digital-to-analog converter (DAC) and the calibrate DAC (discussed in detail below) is to provide the range of current to satisfy all DC operating frequencies.

In addition to the above DC requirements, the DACs are used in this invention to maintain proper small signal or dynamic behavior on a per cycle measure over all operating frequencies. In order for the phase response to be constant over a range of operating frequencies the proportional corrections must scale as the magnitude of frequency and the integral corrections must scale as frequency squared. It is important to maintain constant behavior on a per cycle basis because data is read and written on a per cycle basis and it is necessary to maintain constant performance over all operating frequencies. For example, prior to reading actual data on a sector the proper phase must be acquired. If phase is acquired in 12 bytes at 100 MHz then phase should be acquired in 12 bytes at 400 MHz even though there is a 4:1 ratio in the actual time required at these two operating frequencies.

With the invention both proportional and integral corrections are scaled by the band and calibrate DACs as is the DC bias current. To a first approximation, the ICO large signal gain is constant, i.e. linear. The nominal DAC input bias current is for example, 50 uA. If a 200 MHz operating frequency is desired the DACs multiply the bias current by a factor, say 4. If the frequency is to be doubled, the new scaling factor must be approximately 8 to produce a frequency of 400 MHz. As shown below, with the invention the dynamic corrections, both proportional and integral, are multiplied by the same scaling factor which approximately scales them with changes in operating frequency.

Figure 2:
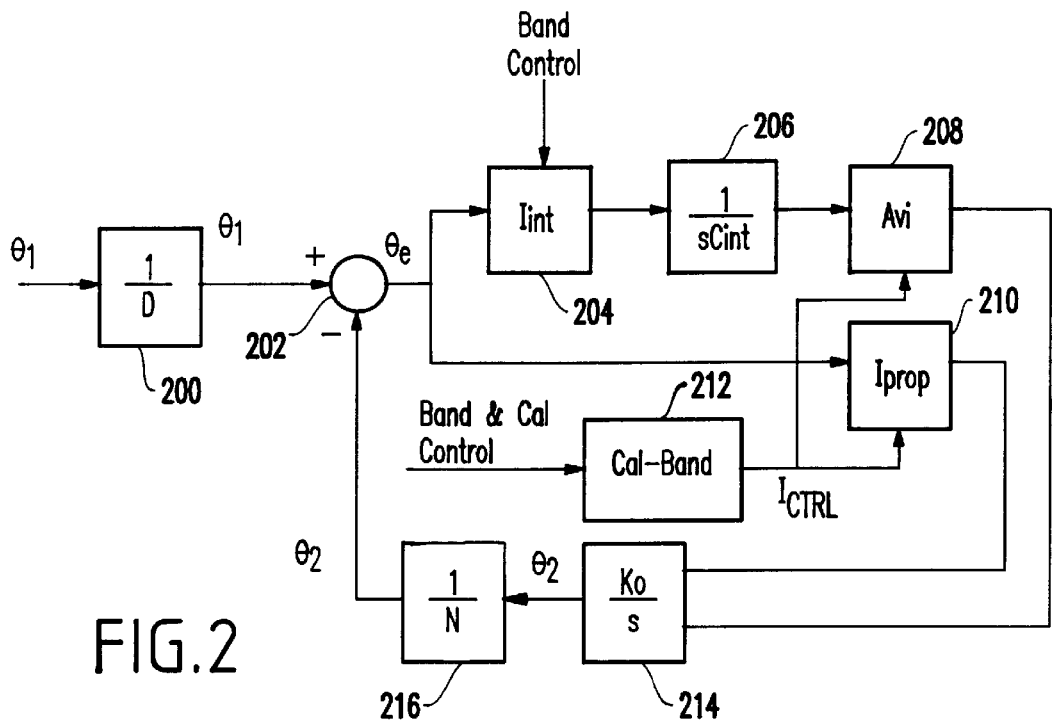
FIG. 2 is a schematic diagram of a frequency synthesizer.

In FIG. 2 a frequency divider 200 divides the reference frequency which is supplied to the feedback loop. The circuit shown in FIG. 2 is a proportional-integral (P-I) circuit and includes an integral charge pump 204 (receiving Band control as an input) and a proportional charge pump 210. This essentially provides an integral path 204, 206, 208 and a proportional path 210. The integral path also includes a capacitor integrator 206 and a transconductance amplifier or voltage to current converter 208.

Phase detector 202 produces the error signal $\theta_e$ between input phase $\theta_1$ and feedback phase $\theta_2$. The error signal is processed by two parallel paths, the integral path 204, 206, and 208 and the proportional path 210. The integral path comprises integral charge pump 204, capacitor integrator 206, and voltage to current converter 208. The proportional path includes proportional charge pump 210. The signals from both the proportional and integral paths are used to control the current controlled oscillator (ICO) 214. The proportional and integral signals may alternatively be summed and the resultant sum used to control the frequency of oscillator 214.

In addition, a calibration and bandwidth amplifier is shown as item 212. While this is shown as a single item, as would be known by one ordinarily skilled in the art given this disclosure, item 212 could easily be understood to be two separate devices. Such amplifiers are generally digital to analog converters.

FIG. 2 describes a bipolar process implementation. The voltage to current converter 208 and proportional charge pump 210 of FIG. 2 are both implemented as the circuit of FIG. 1. The output of the calibrate and band DACs 212 is the signal $I_{CTRL}$ which scales the signal processed by 208 and 210.

Digital band and calibrate inputs to the calibrate and banding DAC 212 produce the control current $I_{CTRL}$ which scales the gain of the voltage to current converter 208 and the proportional charge pump 210. As previously mentioned, scaling is necessary to control both the DC operating frequency and the loop transient response on a per bit interval.

The signal output from the calibration-bandwidth amplifier 212 is input to the proportional charge pump 210 and the transconductance amplifier 208. Output from the integral path and the proportional path are supplied to an oscillator 214. The oscillator 214 effectively integrates the phase. For this reason, oscillators are modeled as integrators in PLLs.

The scaling of the error signals in FIGS. 1 and 2 depend on the logarithmic impedance of the diode loads. Devices having a logarithmic impedance similar to 14 in FIG. 1 are not available in an all CMOS process. For this reason a novel CMOS topology is required to achieve the same scaling as the bipolar solution.

Figure 3:
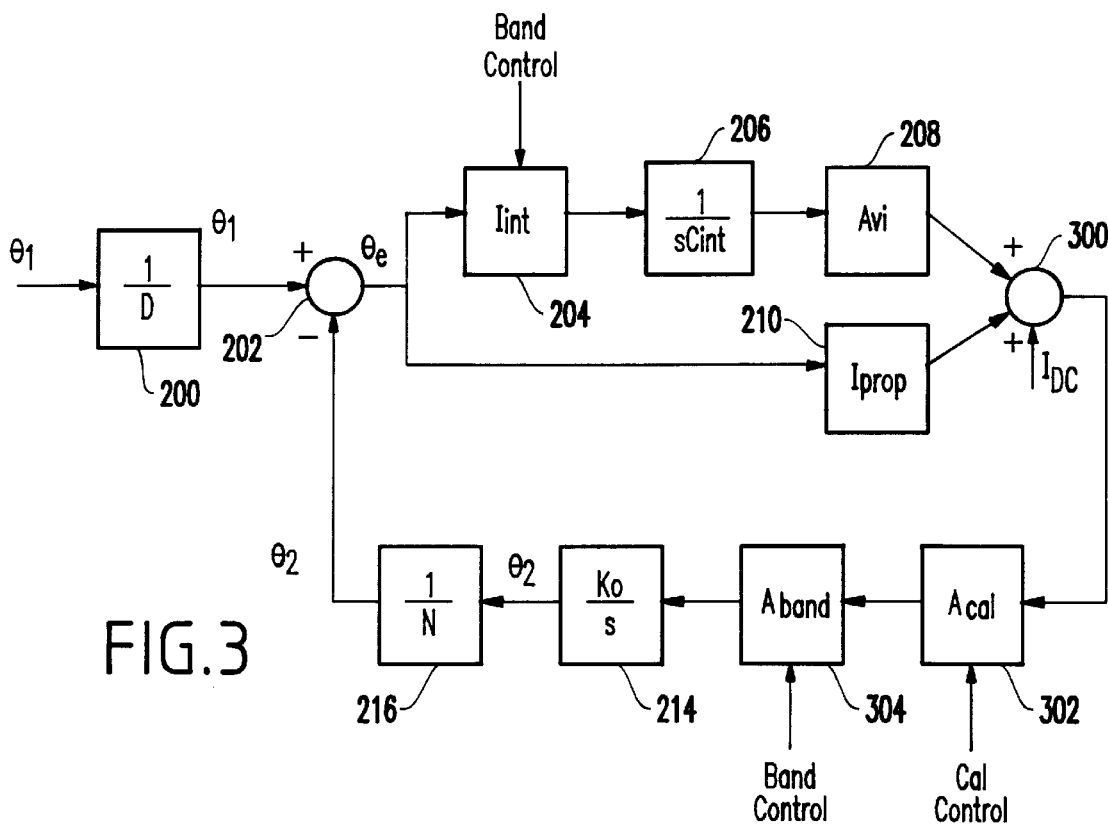
FIG. 3 is a schematic diagram of a frequency synthesizer.

To overcome these disadvantages, the invention includes the structure shown in FIG. 3. The structure shown in FIG. 3 is similar to the structure shown in FIG. 2 and the same items are given the same identification numbers. The structure shown in FIG. 3 is different than the structure shown in FIG. 2 in that the banding amplifier 304 and the calibration amplifier 302 are supplied with the combined signals from the integral path and the proportional path as well as band and calibrate signals. The signals are combined by adder 300 which is also supplied with an input current $I_{DC}$. Then, this signal is supplied to the oscillator 214.

The scaling achieved with diode loads in FIG. 2 is achieved with digitally controlled current multipliers in FIG. 3. With the structure shown in FIG. 3, very well regulated and accurate current mirrors can be achieved in an all CMOS process. For this reason, the control DACs 304 and 302 can very accurately scale both the DC bias current used to establish the operating frequency of the PLL and also scale the error corrections by the same factor to maintain desired loop dynamics on a per bit interval.

Consider the example of the circuit of FIG. 3 operating at a frequency $F_1$ with digital band control set at value $B_1$. The loop must adapt to a doubling of frequency to a new operating frequency $F_2$ where $F_2=2F_1$. To initiate this, the banding control is changed to a new value $B_2$ such that $B_2 \approx 2B_1$. The changes effected are that the DC bias current is doubled by the doubling of the gain of 304, the integral control is quadrupled by the doubling of the gain of 204 and the doubling again by the gain of 304, and the proportional control is doubled by the doubling of the gain of 304. Thus, by the setting of one control, the proper DC bias and the proper dynamic control is achieved.

Thus, with the invention, the open loop gain in the discrete z domain has a term from the proportional path and a term from the integral path. Since the phase detector in a sampled data system is a zero order sample-and-hold, the gain can be obtained from the step invariant transform of the continuous time control circuitry. The proportional term is proportional to $$T \frac{1}{z-1}$$

and the integral term is proportional to $$T^2 \frac{z+1}{(z-1)^2}.$$

To cancel the effect of the coefficients of z depending on the operating period T the two terms can be multiplied by the inverse of T, which is the operating frequency, $f_{osc}$. Thus, multiplying the proportional term by the operating frequency and multiplying the integral term by the operating frequency squared will keep performance constant on the discrete time interval z, which is the bit sampling time.

Figure 5:
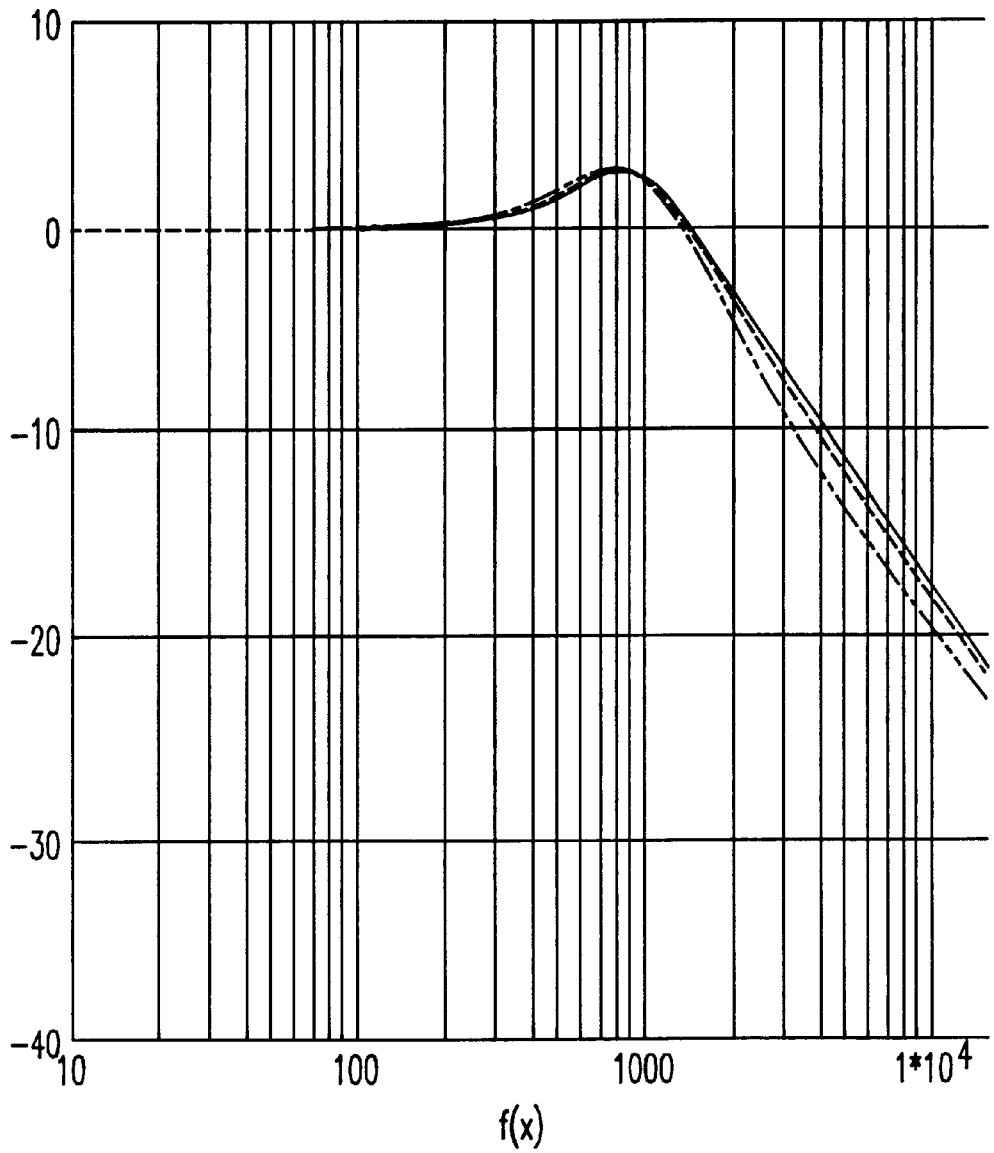
FIG. 5 is a graph illustrating the phase transfer of the frequency synthesizer shown in FIG. 3.

The advantages of the invention shown in FIG. 3 can be seen in FIGS. 4 and 5. FIGS. 4 and 5 show a plot of the frequency synthesizer phase transfer versus frequency. The phase transfer for the loop is defined as the phase of input signal $\theta_1$ from D frequency divider 200 divided by the phase of feedback signal $\theta_2$ from N frequency divider 216. Both FIGS. 4 and 5 show the phase transfer of the synthesizer at three operating frequencies $F_1$, $F_{1.5}$, and $F_2$, where $F_{1.5}=1.5F_1$ and $F_2=2F_1$. When band control to integral charge pump 204 and control DAC 304 is unused, the synthesizer loop dynamics will vary with varying synthesizer frequency, as can be seen in FIG. 4. As the synthesizer frequency is increased from $F_1$ to $F_2$, the phase transfer response becomes less damped and loop bandwidth decreases. FIG. 5 shows the same doubling of synthesizer frequency with the use of band control to the integral charge pump 204 and control DAC 304. Thus, by setting the band control appropriate to the operating frequency, constant loop dynamics are achieved for all frequencies.

Integral corrections are scaled by the same banding bits that control the banding DAC. In this way changes in frequency by the banding bits scale integral corrections with banding frequency. The net effect of the above two scalings is to scale proportional corrections by frequency and integral corrections by frequency squared. This satisfies the conditions for keeping dynamic behavior constant on a per bit basis over all operating frequencies.

Banding and calibrate controls are used to change the operating frequency of a hard disk drive. The calibrate control tunes to a coarse center frequency about which the data will be read. The data rate will change over a 2:1 ratio controlled by the banding control about the center frequency set by the calibrate control. At all operating frequencies the proper loop dynamics must be maintained.

As discussed above, with the invention a proportional path supplies a proportional signal to the calibration amplifier and an integral path supplies an integral signal (a signal that is integrated in time) to the calibration amplifier. The proportional signal and the integral signal are summed and multiplied by the same scaling factor of the calibration amplifier and the bandwidth amplifier, which approximately scales them with changes in operating frequency. Thus, with the invention both proportional and integral corrections are scaled by the band and calibrate DACs as is the DC bias current.

The proportional signal and the integral signal are scaled with changes in the reference frequency. The integral path includes multiple amplifiers, such that the proportional signal is scaled by the reference frequency and the integral signal is scaled by the reference frequency squared. Thus, the feedback loop has a dynamic behavior that is constant on a per bit basis over all operating frequencies.

While the invention has been described in terms of preferred embodiments, those skilled in the art will recognize that the invention can be practiced with modification within the spirit and scope of the appended claims. For example, the above describes the control of an oscillator in a hard disk drive timing control loop. According to the language of control theory the oscillator is the plant being controlled. The same principles can be applied to any plant in any sampled time control loop to maintain performance on a bit interval basis over a range of operating frequencies.

What is claimed is:

1. A complementary metal oxide semiconductor oscillator controller comprising:
   an input for receiving a reference frequency; and
   a feedback loop determining a phase error based on said reference frequency,
   wherein said feedback loop includes:
      a calibration amplifier;
      a banding amplifier in series with said calibration amplifier;
      a proportional path supplying a proportional signal to said calibration amplifier; and
      an integral path supplying an integral signal to said calibration amplifier.

2. A complementary metal oxide semiconductor oscillator controller comprising:
- an input for receiving a reference frequency; and
- a feedback loop determining a phase error based on said reference frequency,
- wherein said feedback loop includes:
  - a calibration amplifier;
  - a banding amplifier in series with said calibration amplifier;
  - a proportional path supplying a proportional signal to said calibration amplifier; and
  - an integral path supplying an integral signal to said calibration amplifier,
- wherein said feedback loop has a dynamic behavior that is constant on a per bit basis over all operating frequencies.

3. The oscillator controller in claim 2, wherein said proportional signal and said integral signal are multiplied by a same scaling factor of said calibration amplifier and said banding amplifier.

4. The oscillator controller in claim 2, wherein said proportional signal and said integral signal are scaled with changes in said reference frequency.

5. The oscillator controller in claim 2, wherein said integral path includes a first amplifier, and said banding amplifier and said first amplifier receive a same control input such that said proportional signal is scaled by said reference frequency and said integral signal is scaled by said reference frequency squared.

6. The oscillator controller in claim 2, wherein said calibration amplifier and said banding amplifier scale said proportional signal and said integral signals as a percent of oscillator bias current.

7. The oscillator controller in claim 2, wherein said calibration amplifier and said banding amplifier comprise digital to analog converters.

8. A complementary metal oxide semiconductor circuit comprising:
- an input for receiving a reference frequency; and
- a feedback loop determining a phase error based on said reference frequency,
- wherein said feedback loop includes:
  - a calibration amplifier;
  - a banding amplifier in series with said calibration amplifier;
  - a proportional path supplying a proportional signal to said calibration amplifier; and
  - an integral pat supplying an integral signal to said calibration amplifier; and
- an oscillator connected to said feedback loop, wherein output from said banding amplifier controls said oscillator.

9. A complementary metal oxide semiconductor circuit comprising:
- an input for receiving a reference frequency; and
- a feedback loop determining a phase error based on said reference frequency,
- wherein said feedback loop includes:
  - a calibration amplifier;
  - a banding amplifier In series with said calibration amplifier,
  - a proportional path supplying a proportional signal to said calibration amplifier; and
  - an integral path supplying an integral signal to said calibration amplifier; and
- an oscillator connected to said feedback loop, wherein output from said banding amplifier controls said oscillator,
- wherein said feedback loop has a dynamic behavior that is constant on a per bit basis over all operating frequencies.

10. The complementary metal oxide semiconductor circuit in claim 9, wherein said proportional signal and said integral signal are multiplied by a same scaling factor of said calibration amplifier and said banding amplifier.

11. The complementary metal oxide semiconductor circuit in claim 9, wherein said proportional signal and said integral signal are scaled with changes in said reference frequency.

12. The complementary metal oxide semiconductor circuit in claim 9, wherein said integral path includes a first amplifier, and said banding amplifier and said first amplifier receive a same control input such that said proportional signal is scaled by said reference frequency and said integral signal is scaled by said reference frequency squared.

13. The complementary metal oxide semiconductor circuit in claim 9, wherein said calibration amplifier and said banding amplifier scale said proportional signal and said integral signals as a percent of oscillator bias current.

14. The complementary metal oxide semiconductor circuit in claim 9, wherein said calibration amplifier and said banding amplifier comprise digital to analog converters.

15. A complementary metal oxide semiconductor oscillator controller comprising:
- an input for receiving a reference frequency; and
- a feedback loop determining a phase error based on said reference frequency,
- wherein said feedback loop includes:
  - a calibration amplifier;
  - a banding amplifier in series with said calibration amplifier;
  - a proportional path supplying a proportional signal to said calibration amplifier; and
  - an integral path supplying an integral signal to said calibration amplifier,
- wherein said integral path includes a first amplifier, and
- wherein said banding amplifier and said first amplifier receive a same control input such that said proportional signal is scaled by said reference frequency and said integral signal is scaled by said reference frequency squared to maintain a dynamic behavior of said feedback loop that is constant on a per bit basis over all operating frequencies.

16. The oscillator controller in claim 15, wherein said proportional signal and said integral signal are multiplied by a same scaling factor of said calibration amplifier and said banding amplifier.

17. The oscillator controller in claim 15, wherein said proportional signal and said integral signal are scaled with changes in said reference frequency.

18. The oscillator controller in claim 15, wherein said calibration amplifier and said banding amplifier scale said proportional signal and said integral signals as a percent of oscillator bias current.

19. The oscillator controller in claim 15, wherein said calibration amplifier and said banding amplifier comprise digital to analog converters.

* * * * *